United States Patent [19]

Kim

[11] Patent Number: 5,719,078
[45] Date of Patent: Feb. 17, 1998

[54] METHOD FOR MAKING A THIN FILM TRANSISTOR PANEL USED IN A LIQUID CRYSTAL DISPLAY HAVING A COMPLETELY SELF-ALIGNED THIN FILM TRANSISTOR

[75] Inventor: Dong-Gyu Kim, Suwon, Rep. of Korea

[73] Assignee: Samsung Electronics Co., Ltd., Suwon, Rep. of Korea

[21] Appl. No.: 600,054

[22] Filed: Feb. 12, 1996

[30] Foreign Application Priority Data

Feb. 11, 1995 [KR] Rep. of Korea ............... 95-2510

[51] Int. Cl.$^6$ ................................................. H01L 21/84
[52] U.S. Cl. ...................... 438/158; 438/160; 438/609; 257/59; 257/60
[58] Field of Search ................. 438/158, 159, 438/160, 163, 164, 608, 609; 257/57, 59, 60, 61, 749

[56] References Cited

U.S. PATENT DOCUMENTS

| | | | |
|---|---|---|---|
| 4,685,195 | 8/1987 | Szydlo et al. | 438/160 |
| 5,091,337 | 2/1992 | Watanabe et al. | 438/160 |
| 5,229,644 | 7/1993 | Wakai et al. | 257/749 |
| 5,371,025 | 12/1994 | Sung | 438/160 |
| 5,478,766 | 12/1995 | Park et al. | 437/158 |
| 5,614,728 | 3/1997 | Akiyama | 257/61 |

FOREIGN PATENT DOCUMENTS

| | | | |
|---|---|---|---|
| 2-155275 | 6/1990 | Japan | 257/61 |
| 3-44968 | 2/1991 | Japan | 257/60 |

*Primary Examiner*—Charles L. Bowers, Jr.
*Assistant Examiner*—Leon Radomsky
*Attorney, Agent, or Firm*—Cushman Darby & Cushman IP Group of Pillsbury Madison & Sutro LLP

[57] ABSTRACT

A method for making a completely self-aligned thin film transistor panel of a liquid crystal display includes the steps of: forming a gate electrode on a transparent substrate; depositing sequentially a first insulating layer, a semiconductor protecting layer aligned with the gate electrode by patterning the second insulating layer; implanting ions into the semiconductor layer; depositing a conductive layer; patterning the conductive layer together with the semiconductor layer; forming a passivation layer including both a first opening and a second opening, forming a pixel electrode connected to the conductive layer through the second opening; etching the conductive layer by using both the pixel electrode and the passivation layer as a mask to form a source electrode and a drain electrode. The conductive layer and semiconductor layer are patterned in a single process step in the present invention, while the conductive layer and semiconductor layer are separately patterned in the conventional method. Accordingly, the number of the masks is reduced, thereby reducing the cost of production and embodying a completely self-aligned TFT.

6 Claims, 9 Drawing Sheets

METHOD FOR MAKING A THIN FILM TRANSISTOR PANEL USED IN A LIQUID CRYSTAL DISPLAY HAVING A COMPLETELY SELF-ALIGNED THIN FILM TRANSISTOR

BACKGROUND OF THE INVENTION (1.) Field of the Invention

The present invention relates to a method for making a thin film transistor (hereinafter referred to as a TFT) panel used in a liquid crystal display (hereinafter referred to as an LCD). More particularly, this invention relates to a method for making a TFT panel having a completely self-aligned TFT.

(2.) Description of the Prior Art

Generally, in a TFT-LCD using an amorphous silicon (hereinafter referred to as a-Si), a black resistance responsive to an OFF-state of the TFT is high, thereby increasing a switching efficiency. In addition, the TFT is formed at a low temperature smaller than 350° C., and is applicable to a large-sized glass substrate, so that it is now being produced on a commercial scale as the main device.

FIG. 1 shows a cross-sectional view of an insulator semiconductor insulator (ISI) TFT or etchstopped TFT, among the conventional TFTs with a-Si. Deposited over a substrate 1 are a gate electrode 3, gate oxide layer 4, gate insulating layer 5, a-Si layer 7, channel protector or etchstopper 10, contact layer 8, source electrode 12, drain electrode 12', and pixel electrode 17.

However, the above-identified TFTs have problems that will be described in the following description.

First, parasitic capacitances between a source electrode and a drain electrode and between a drain electrode and a gate electrode, deteriorates characteristics of the TFT. If the parasitic capacitance grows lower, then a storage capacitance becomes reduced, thereby increasing the aperture ratio and reducing the size of the TFT. An offset voltage of a pixel can be also reduced. Therefore the parasitic capacitance is important in TFT-LCD.

Next problem is a leakage current. If a-Si layer used as an active area of the TFT is irradiated to the light, then a current is produced. As a result, the characteristics of the device decrease because of the leakage current. In particular, since a panel used for either over head projector (OHP) or projector requires the intensive backlights, an optical leakage current is more generated, thereby reducing a display characteristic.

To obviate the above problems of the prior art, a self-alignment method has been studied. As for the self-alignment method in TFT, the etchstopper is first aligned to a gate electrode to reduce a parasitic capacitance (this process if called a partial self-alignment widely used for fabricating a semiconductor device, and is described in FIG. 1). The a-Si layer is then aligned to the gate electrode to reduce the optical leakage current. Methods for proceeding the above steps will be more specifically described in following.

FIGS. 2A and 2B are respectively a cross-sectional view and a plan view of a TFT manufactured by a process introduced to 'A 10.4" diagonal full color TFT LCD with new self-aligned a=Si TFTs for OHP system' published by IEEE, 1991. As shown in FIG. 2A, when an a-Si layer 7, a contact layer 8 and an etchstopper 10 are completely aligned to a gate electrode 3, an overlapping portion among gate electrode 3, source electrode 12 and drain electrode 12' is reduced, thereby reducing the parasitic capacitance. Also, the light from the rear side of the TFT is completely prevented from coming to the a-Si layer, thereby reducing the optical leakage current.

However, as described above, if the contact layer 8 is aligned to the gate electrode 3, a contact area between the contact layer 8 and the source electrode 12 or between the contact layer 8 and the drain electrode 12' is reduced and a contact resistance increases. Accordingly, the TFT's ON-state characteristic decreases due to the increased contact resistance. To compensate the decreased characteristic, an $N^+$ amorphous silicon in the contact layer 8 is microcrystalized, so that a resistance of the contact layer 8 is reduced. Therefore, ON characteristic is maintained.

However, since the conventional self-aligned TFT described above requires a new process called as a microcrystallization to maintain the characteristics of TFT, not only the overall process has been complicated, but also the cost of production has increased.

FIGS. 3A and 3B are respectively a cross-sectional view and a plan view of a TFT manufactured by a process introduced to 'A completely self-aligned a-Si TFT' in academic society paper, namely, SID 93 digest. According to this paper, the etchstopper 10 is first aligned to the gate electrode 3 thereby controlling a parasitic capacitance. By using the etchstopper 10 as a mask, an N-type impurity of the high density is implanted and diffused to a-Si layer 7 exposed to outside of etchstopper 10, so that amorphous silicon is converted to $N^+$ silicon to form an contact layer 8. According to the above steps, the a-Si layer 7 exposed to outside of the etchstopper 10 is minimized, thereby minimizing the optical leakage current. The electrical resistance of the contact layer 8 connecting a channel part of the a-Si layer 7 to source electrode 12 and drain electrode 12' is high. To solve the high electrical resistance, a silicide layer 81 having a low resistance is formed by depositing a metal such as molybdenum on the contact layer 8 and etched then.

In using a method for making a completely self aligned TFT using an ion implantation, not only the etchstopper and the channel layer are aligned to gate electrode but also a source electrode and a drain electrode are aligned to the gate electrode. Accordingly, parasitic capacitance between the gate electrode and the source electrode or between the gate electrode and the drain electrode can be reduced, the channel layer is not exposed to the light.

However, in the above-method, the processes for injecting and diffusing the impurity are added to preserve a characteristic of a device, so that the mask is more needed to a manufacturing process as compared with the prior process by more than one mask.

SUMMARY OF THE INVENTION

An object of the present invention is to provide a method for making a completely self-aligned TFT for reducing the number of mask needed to a fabrication of TFT as well as having the advantage of ion implantation, that substantially obviates one or more of the problems due to limitation and disadvantages of the related art.

In order to achieve this object, a method for making a completely self aligned TFT according to the present invention includes the steps of:

forming a gate electrode on a transparent substrate;

forming sequentially a gate insulating layer, a semiconductor layer and a first insulating layer, forming a channel protecting layer aligned with the gate electrode by patterning the first insulating layer;

implanting an ion in the semiconductor layer;

depositing a conductive layer;

patterning the conductive layer together with the semiconductor layer;

forming a passivation layer including both a first opening and a second opening;

forming a pixel electrode connected to the conductive layer through the second opening; and etching the conductive layer by using both the pixel electrode and the second insulating layer as a mask to form a source and a drain electrodes.

It is desirable that the gas for the ion implantation should be a mixed gas in which $PH_3$ is mixed to a hydrogen.

As shown in FIG. 3, the conventional method requires at least six masks for patterning such as the gate electrode, the etchstopper, the a-Si layer, the source and drain electrodes, the passivation layer, and the pixel electrode, etc. In the present invention, the number of the masks is five, each used in patterning the gate electrode, the channel protecting layer, the conductive layer, the semiconductor layer, the second insulating layer and the pixel electrode. In conclusion, the conductive layer and the semiconductor layer are patterned using a single mask in the present invention, while they are separately patterned by using separate masks in the conventional method. Therefore, the number of the mask is reduced by one.

BRIEF DESCRIPTION OF THE DRAWINGS

The preferred embodiments of the present invention will now be described more specifically with reference to the attached drawings, wherein:

FIGS. 1A–9B are cross sectional and plan views that sequentially show a method for making a TFT panel of an LCD in accordance with a preferred embodiment of the present invention.

DETAILED DESCRIPTION OF THE PREFERRED EMBODIMENT

The preferred embodiment of the present invention will become apparent from a study of the following detailed description, when viewed in light of the accompanying drawings.

Figure 1:
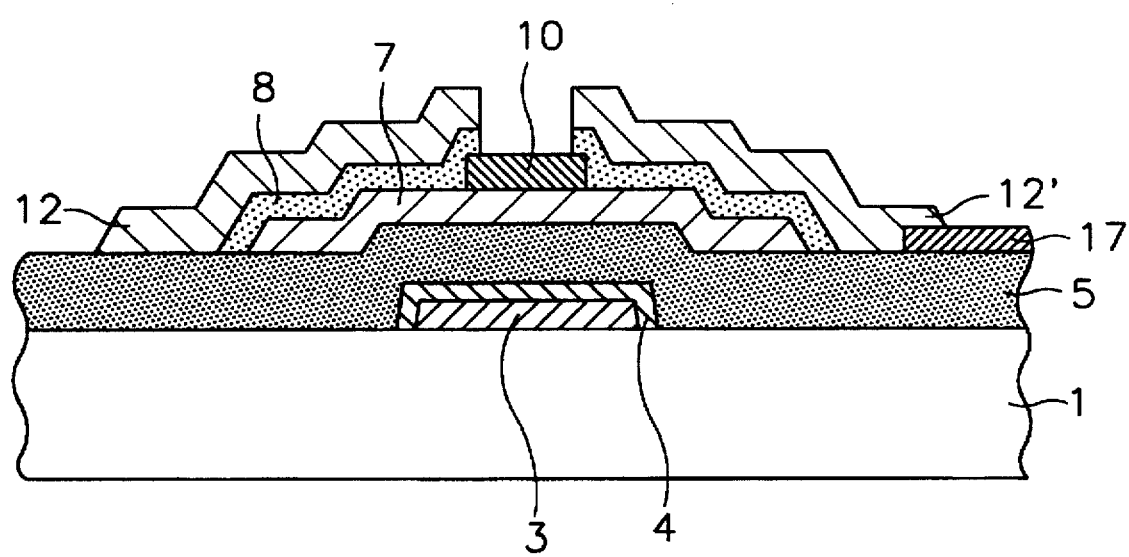
FIG. 1 is a cross-sectional view of a TFT panel of an LCD employing an etchstopper type TFT.
Figure 2A:
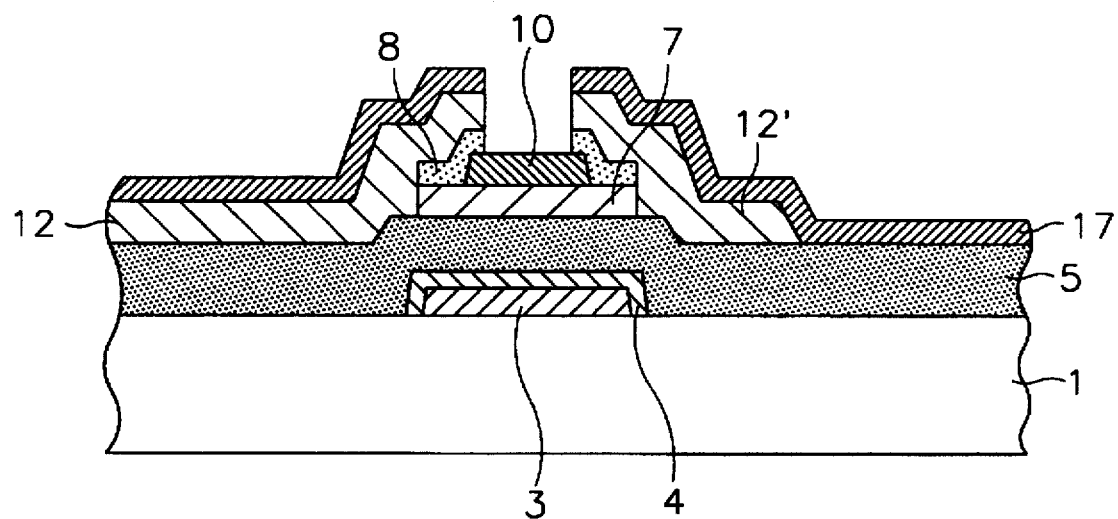
FIGS. 2A and 2B are a cross-sectional view and a plan view of a conventional TFT panel.
Figure 2B:
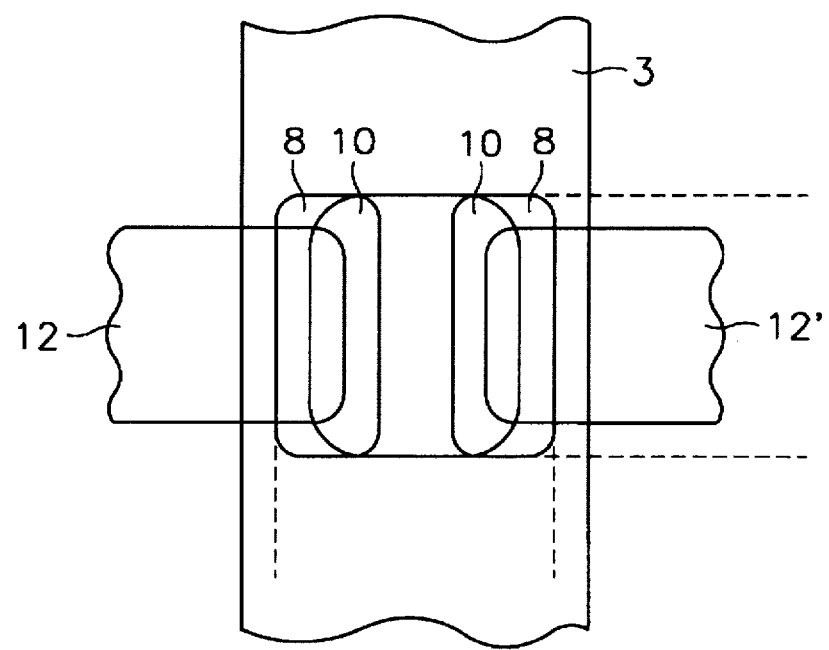
Figure 3A:
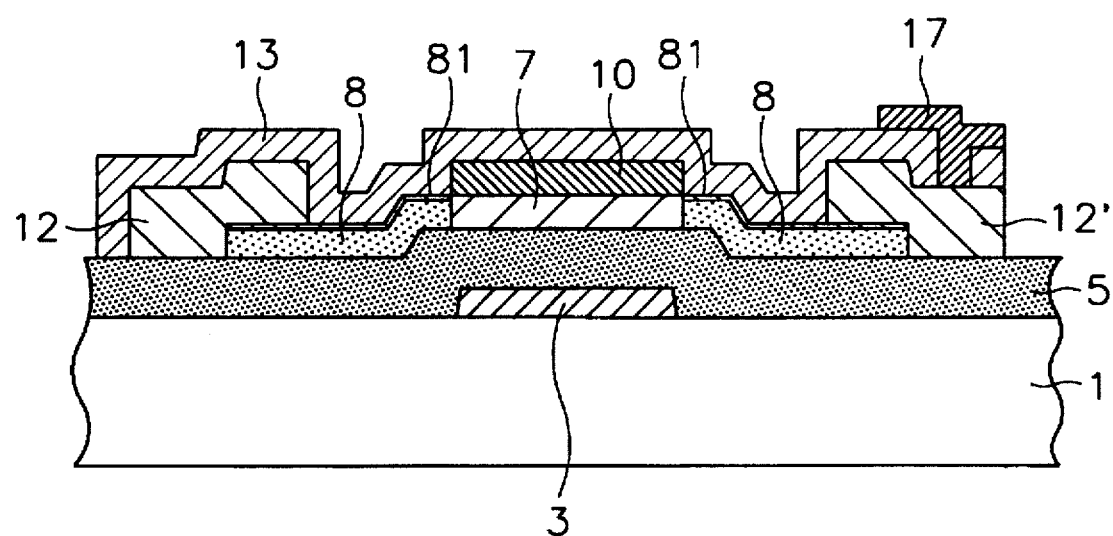
FIGS. 3A and 3B are a cross-sectional view and a plan view of another conventional TFT panel.
Figure 3B:
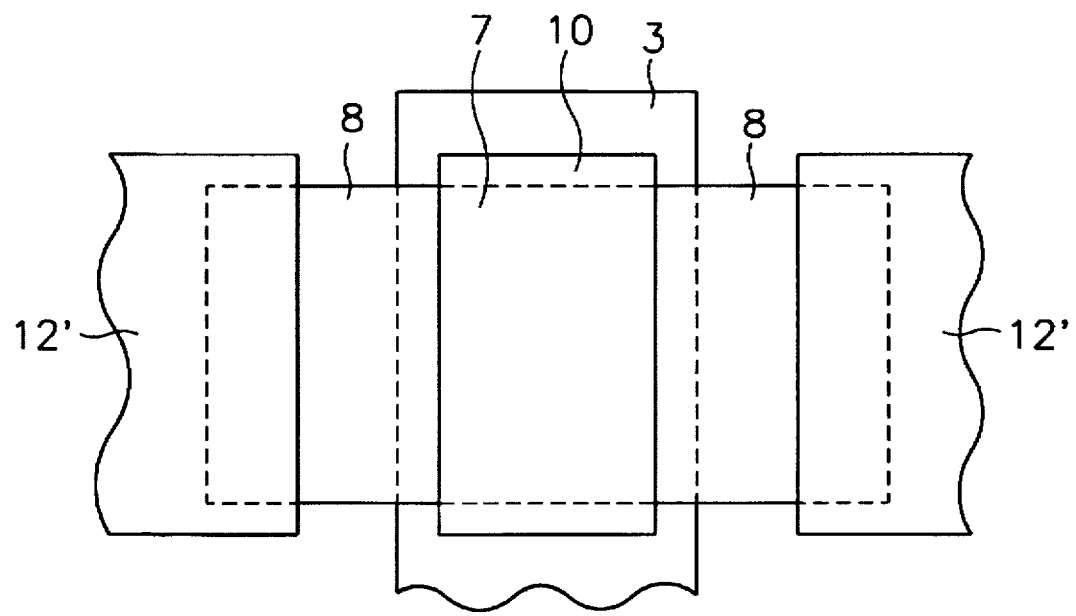
Figure 4A:
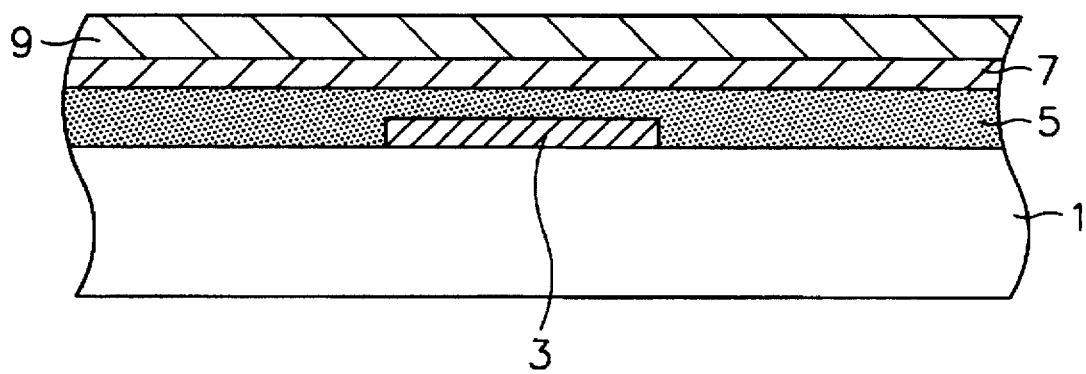
Figure 4B:
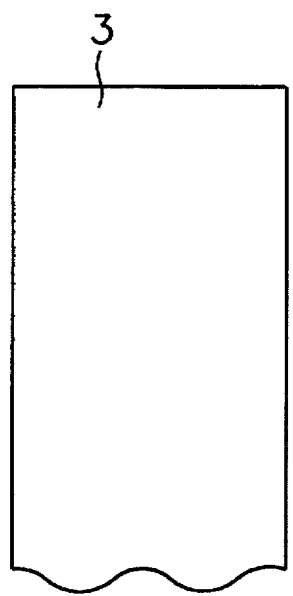

As shown in FIGS. 4A and 4B, a conductive layer is deposited material such as glass or quartz. A gate electrode 3 is formed by patterning the conductive layer. A gate insulating layer 5 is deposited by a thickness of 300 nm. A semiconductor layer 7 of amorphous silicon is deposited by a thickness of 50 nm. A gate insulating layer 9 of SiNx is deposited by a thickness of 200 nm at temperature 200° C.

Figure 5A:
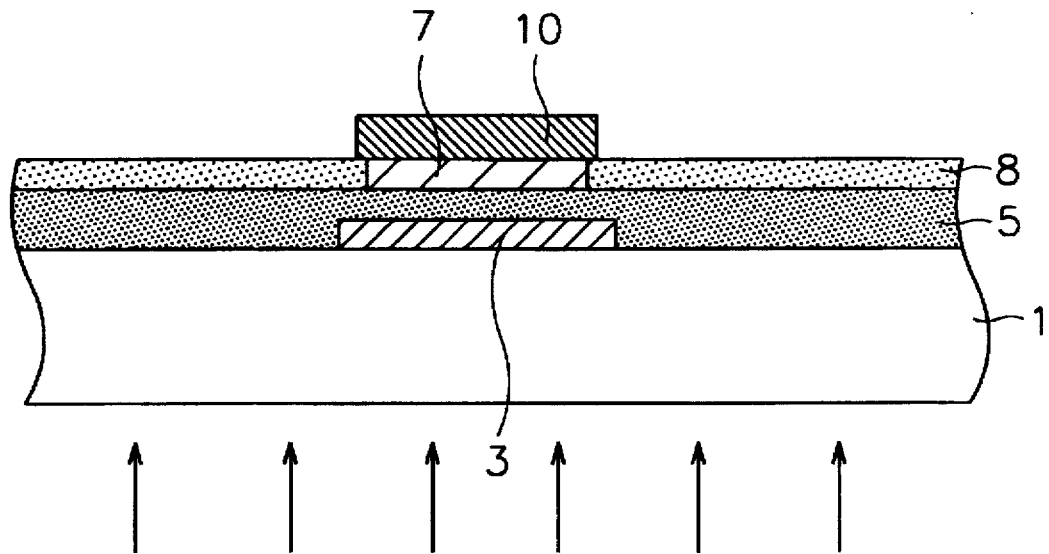
Figure 5B:
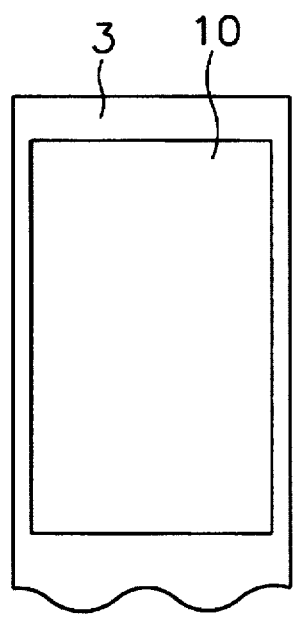

As shown in FIGS. 5A and 5B, a photoresist is deposited. The photoresist is exposed to light through the backside of the substrate 1, and developed. Etchstopper or channel protecting layer 10 is formed by etching the insulating layer 9. The mixture of $H_2$ gas and 10% $PH_3$ gas is implanted. The photoresist is removed and the diffusion process is performed. Width of the gate electrode 3 should be wider than that of the channel protecting layer 10. It is desirable that the channel protecting layer 10 is placed within the gate electrode 3 by 0.1–1.0 µm from the edges of the gate electrode so that difference between widths of gate electrode 3 and channel protecting layer 10 is 1.0–2.0 µm. A channel will be produced in a portion of semiconductor layer 7 under the channel protecting layer 10. Another portion 8 of the semiconductor layer 7 has a resistance lower than that of the channel portion by ion doping. Under this condition, if the ion is implanted with a dose of $10 \times 10^{16}/cm^2$ and an accelerating voltage of 30 KV, a surface resistance of the ion doped semiconductor layer 8 is about 100 KΩ/□.

Figure 6A:
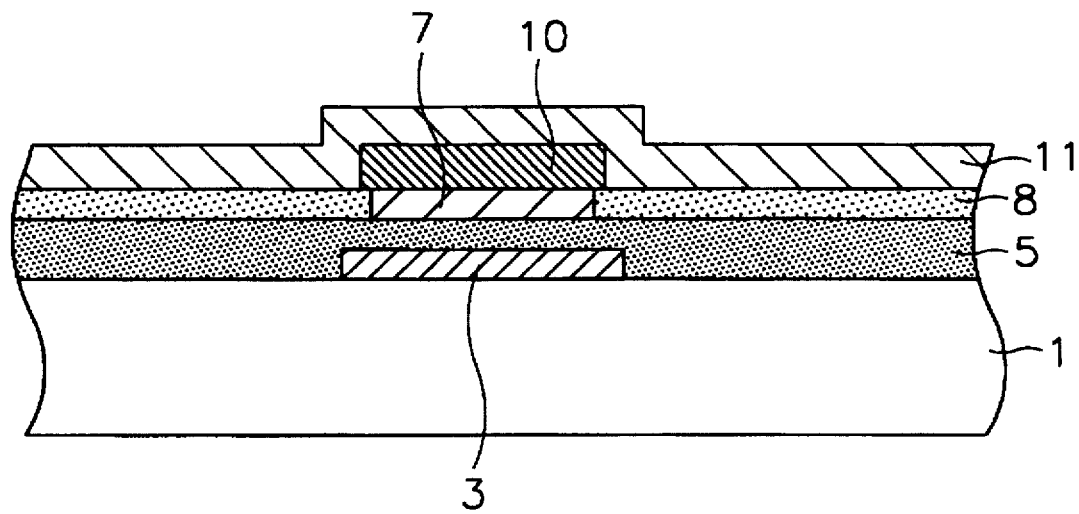
Figure 6B:
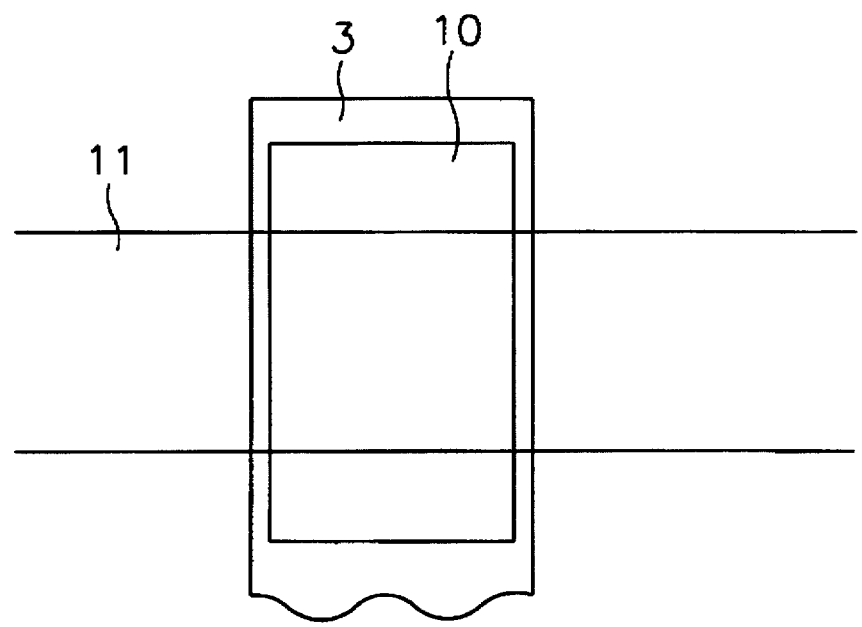

As shown in FIGS. 6A and 6B, a conductive layer 11 such as Cr is deposited. The conductive layer 11 is patterned along with the semiconductor layer 8 as shown in FIG. 6B. But patterns of the semiconductor layer 8 and the conductive layer are not shown in FIG. 6A, as shown in FIG. 6B. If the conductive layer 11 is made of a material which reacts to silicon such as Cr, a silicide is formed on an interface between the semiconductor 8 and the conductive layer 11. A surface resistance of the silicide is between 100 KΩ/□, thereby achieving a good conductivity. Therefore, the silicide sufficiently performs the role of electrode.

Figure 7A:
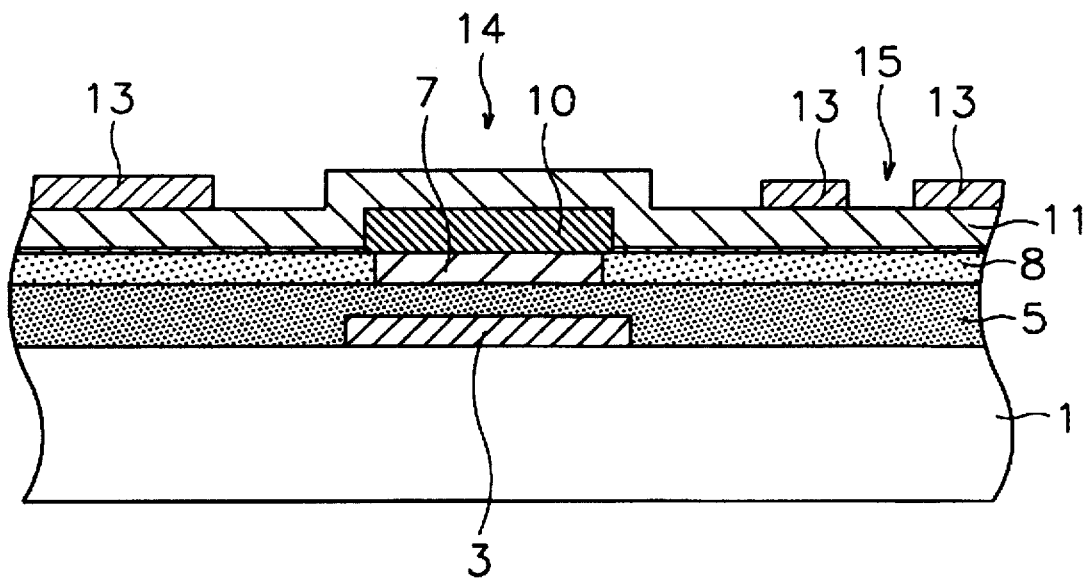
Figure 7B:
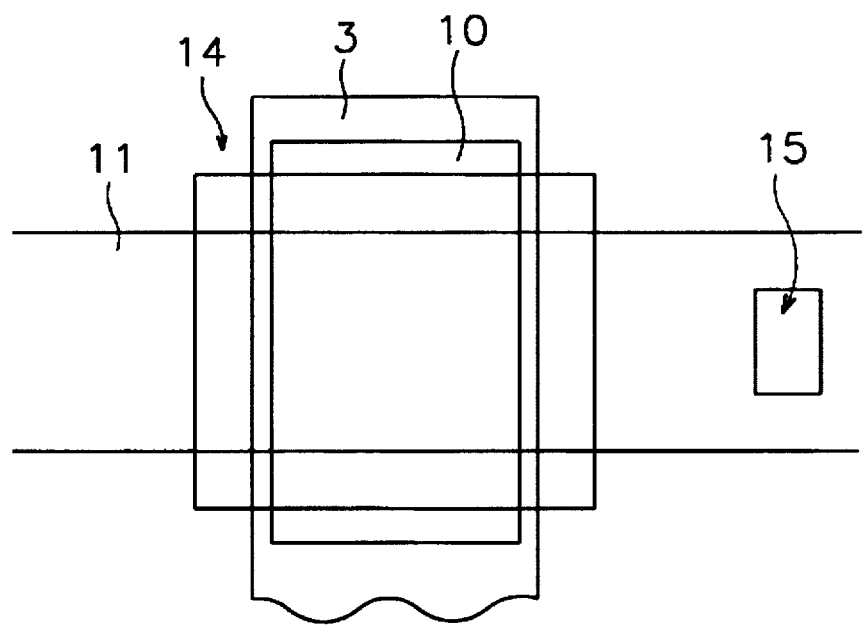

As shown in FIGS. 7A and 7B, a passiviation layer 13 of an insulating material such as SiNx is deposited and patterned. The passivation layer 13 has two openings 14 and 15. A first opening 14 will be used for etching the conductive layer 11. A second opening 15 need to be used for connecting the conductive layer 11 with a pixel electrode which will be formed in later process.

Figure 8A:
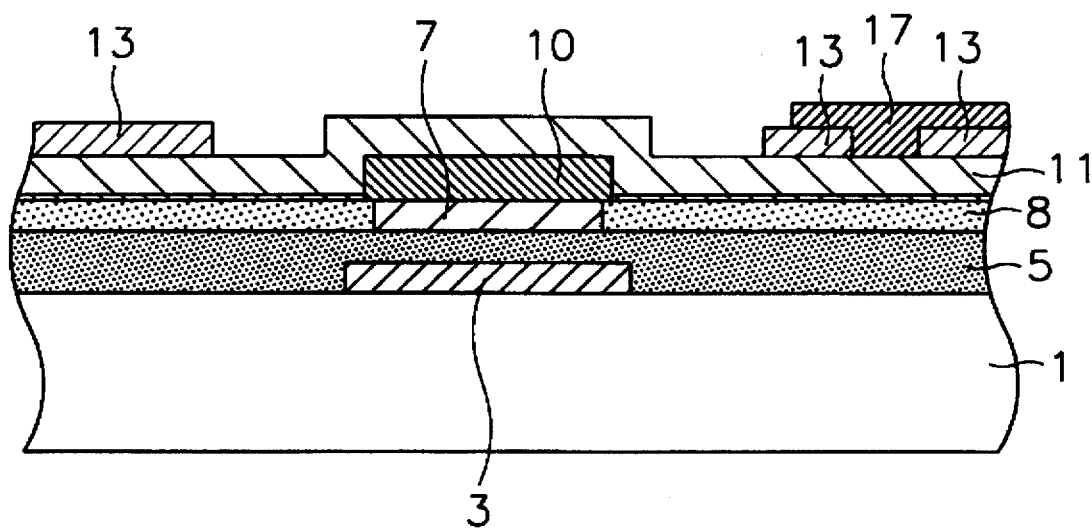
Figure 8B:
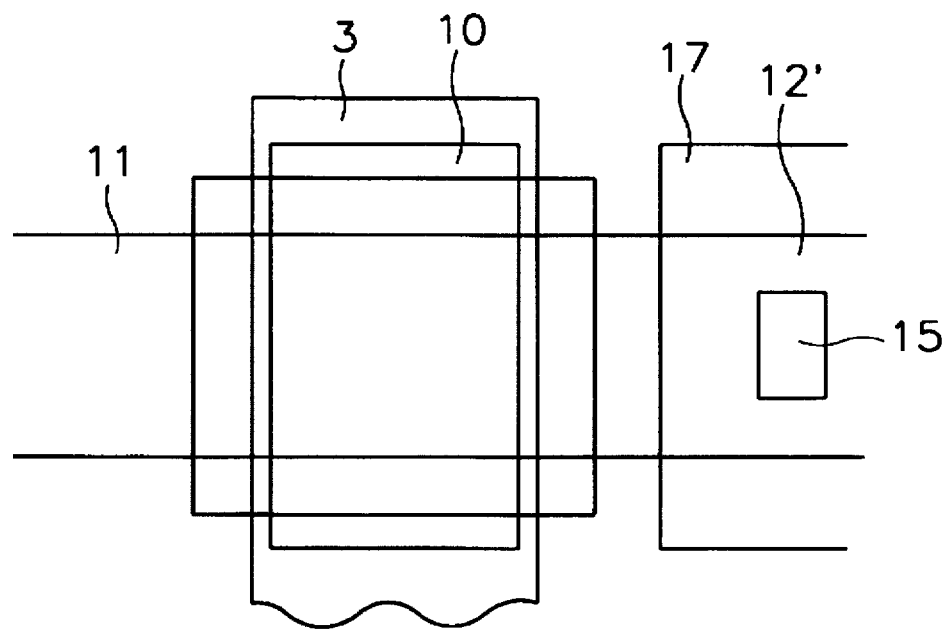
Figure 9A:
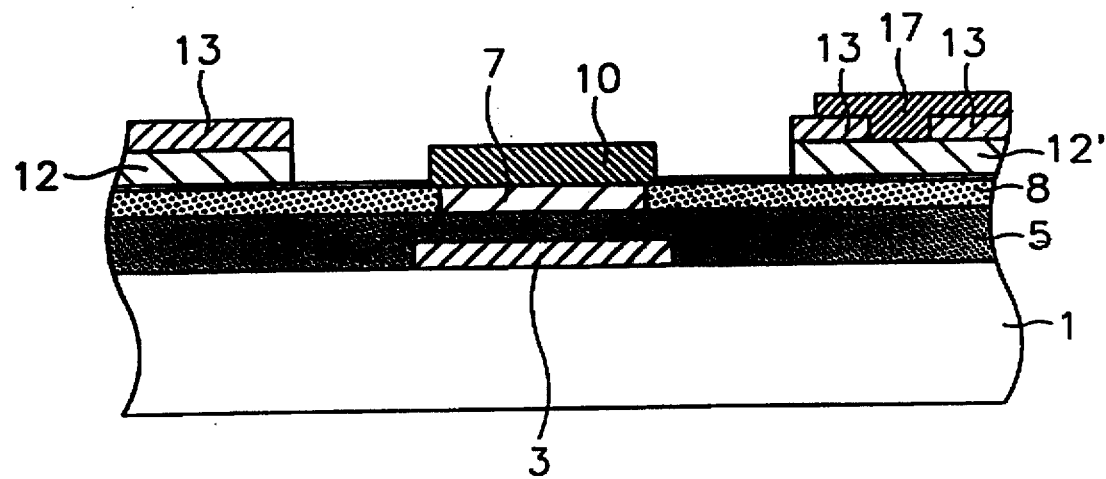
Figure 9B:
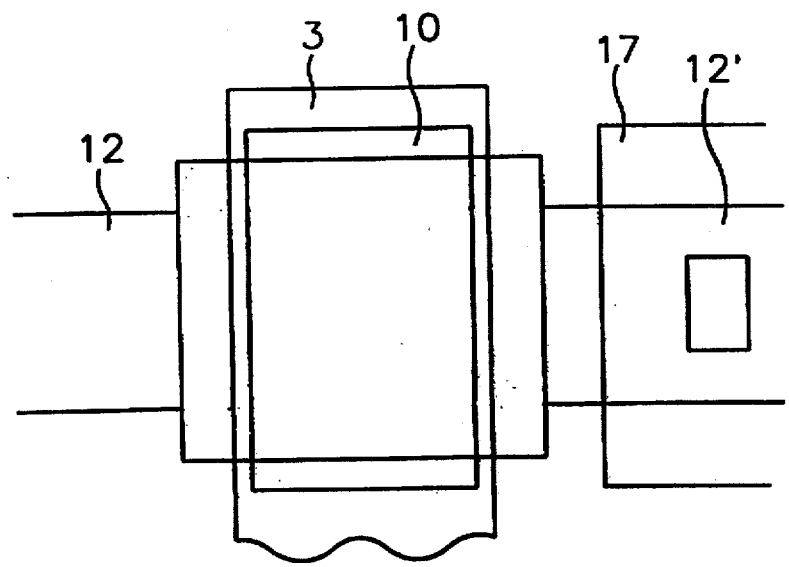

As shown in FIGS. 8A and 8B, a transparent insulating layer as of indium tin oxide (ITO) is deposited. A photoresist is deposited, exposed to light by a mask, and developed. The transparent insulating layer is then etched to form a pixel electrode 17 to be connected to the conductive layer 11 through the second opening.

Finally, when the conductive layer 11 is eliminated by using a residual photoresist and the passivation layer 12 as a mask, the conductive layer 11 of the first opening is etched, thereby forming a source electrode 12 and a drain electrode 12'.

As described above, the conductive layer and semiconductor layer are patterned in a single process step in the present invention, while the conductive layer and semiconductor layer are separately patterned in the conventional art. Accordingly, the number of the masks can be reduced, thereby reducing the cost of production and embodying a completely self-aligned TFT.

What is claimed is:

1. A method for making a thin film transistor panel of a liquid crystal display, comprising the steps of:

forming a gate electrode on a transparent substrate;

depositing sequentially a first insulating layer, a semiconductor layer, and a second insulating layer;

forming a channel protecting layer aligned with the gate electrode by patterning the second insulating layer;

implanting ions into the semiconductor layer;

depositing a conductive layer;

patterning the conductive layer together with the semiconductor layer;

forming a passivation layer including both a first opening and a second opening;

forming a pixel electrode connected to the conductive layer through the second opening; and etching the conductive layer by using both the pixel electrode and the passivation layer as a mask to form a source electrode and a drain electrode.

2. The method as set forth in claim 1, wherein the step of forming the channel protecting layer comprises the steps of:

depositing a photoresist on the second insulating layer;

exposing the photoresist to the light incident from the backside of the transparent substrate;

developing the photoresist;

etching the second insulating layer to form the channel protecting layer; and removing a residual photoresist material.

3. The method as set forth in claim 1, wherein width of the channel protecting layer is narrower than that of the gate electrode.

4. The method as set forth in claim 3, wherein the width of the channel protecting layer is narrower than that of the gate electrode by 1.0–2.0 μm.

5. The method as set forth in claim 1, wherein the ion implantation is performed with a mixture of $H_2$ and $PH_3$.

6. The method as set forth in claim 1, wherein the first opening is over the channel protecting layer.

* * * * *